Figure 1:
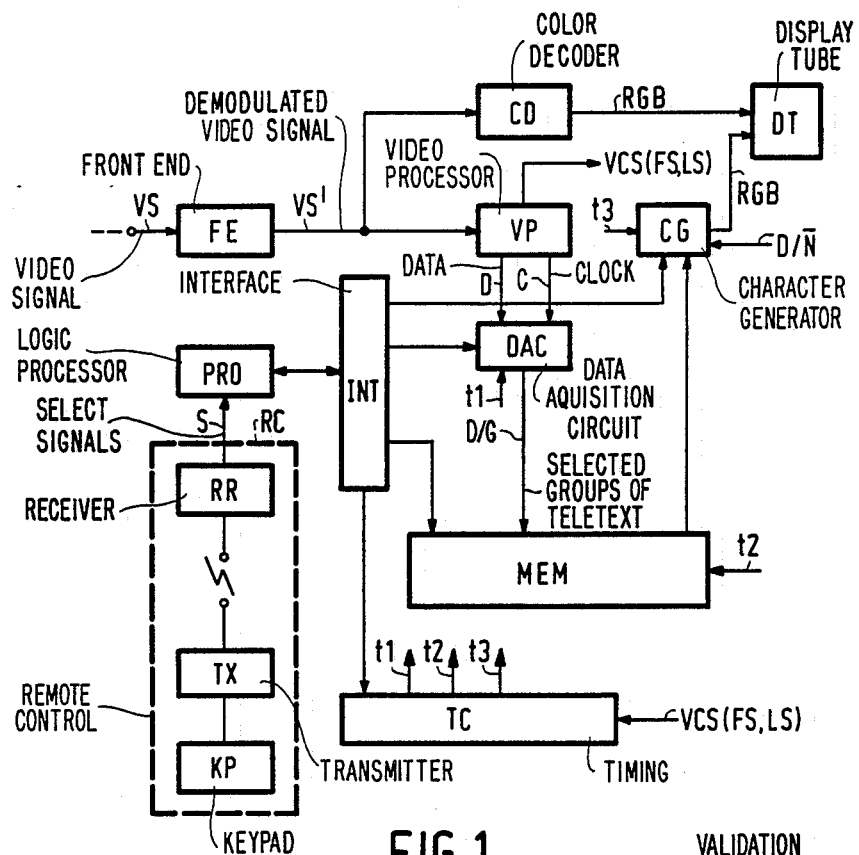

United States Patent [19]

Bugg et al.

[11] Patent Number: 4,963,968
[45] Date of Patent: Oct. 16, 1990

[54] METHOD AND APPARATUS FOR VALIDATING TELETEXT DATA

[75] Inventors: Richard E. F. Bugg, Coulsdon; Nigel Metheringham, South Croydon, both of England

[73] Assignee: U.S. Philips Corporation, New York, N.Y.

[21] Appl. No.: 356,042

[22] Filed: May 23, 1989

[30] Foreign Application Priority Data

May 27, 1988 [GB] United Kingdom ............... 8812592
Apr. 19, 1989 [GB] United Kingdom ............... 8908801

[51] Int. Cl.$^5$ ..................... H04N 7/087; H04N 7/08
[52] U.S. Cl. ................................ 358/147; 358/142
[58] Field of Search ............ 358/141, 142, 146, 147; 371/37.1, 5.1, 5.4

[56] References Cited

U.S. PATENT DOCUMENTS

| 4,577,227 | 3/1986 | Guramarthy | 358/147 |
| 4,593,374 | 6/1986 | Gurumarthy | 358/147 |
| 4,698,677 | 10/1987 | Kinghorn et al. | 358/147 |

FOREIGN PATENT DOCUMENTS 1370535 10/1974 United Kingdom .

OTHER PUBLICATIONS

Mullard Dat Sheet SAA5040 Series Teletext Acquisition and Control Circuit, Jun. 1981.
"Wireless World Teletext Decoder"; Daniels; Wireless World, vol. 81, No. 1480, Dec. 1975, pp. 563-566.
"Teletext Data Decoding-The LSI Approach"; Norris et al., IEEE Transactions on Consumer Electronics, vol. CE-22, No. 3, Aug. 1973, pp. 247-253.
"Broadcast Teletext Specification"; BBC, Sep. 1976.

Primary Examiner—John W. Shepperd
Assistant Examiner—Michael D. Parker
Attorney, Agent, or Firm—Anne E. Barschall

[57] ABSTRACT

A teletext decoder comprises a validation circuit for affording an output (V) when valid teletext data pulses are received. The validation circuit comprises an error checking circuit (SR, FCCC, MDCC, RACC) for affording outputs indicative of the number of errors existing in data pulses corresponding to a Framing Code, and Hamming protected magazine and row address data, and a validation check circuit (A, VCC) for affording an output V indicative of valid teletext data having been received when the combined total of said errors does not exceed one.

10 Claims, 1 Drawing Sheet

METHOD AND APPARATUS FOR VALIDATING TELETEXT DATA

This invention relates principally to a teletext decoder for use in a receiver which is suitable for receiving teletext transmissions, said teletext decoder comprising means for receiving data pulses corresponding to a framing code and Hamming protected magazine and row (or packet) address data included in said transmissions, and validation means operable on said framing code and said Hamming protected magazine and row address data for affording an output indicative of the receipt of valid teletext data. The invention also relates to a teletext receiver incorporating such a decoder and to a method of processing a received teletext transmission.

The publication "Broadcast Teletext Specification", September 1976, published jointly by the British Broadcasting Corporation, Independent Broadcasting Authority and British Radio Equipment Manufacturers' Association, discloses a specification for a teletext transmission of the above type for use in 625-line television systems (e.g. as transmitted in the United Kingdom). Also, a television system for implementing this type of teletext transmission is described in United Kingdom patent specification 1 370 535.

In the above-identified "Broadcast Teletext Specification", a quantity of teletext information to be displayed as an entity on a television screen is termed a page and will be so termed hereinafter. The pages are grouped together to form "magazines", and the aforementioned "Broadcast teletext Specification" specifies that up to eight magazines may be provided, each of which may include up to 100 pages though some pages may comprise rotating sub-pages. All of the pages which are available for display are transmitted in a recurrent cycle, with or without up-dating page information, as appropriate. A teletext television receiver includes a teletext decoder and any page selected by a viewer for display is acquired by the teletext decoder from the cyclic transmission the next time it occurs therein and is stored in a page memory of the teletext decoder until replaced by a subsequently acquired page. A page consists of up to 24 data rows, each having 40 character positions. The first data row (Row 0) of each page is termed a page-header and contains inter-alia the page number. The transmission of each page begins with, and includes, its page-header and ends with, and excludes, the next page-header which is transmitted. Thus, it is assumed that all of the data rows which are transmitted between two successively transmitted different page-headers belong to the page having the first page header. This assumption avoids the need to include in each data row data for identifying the page to which the row belongs.

Each data row carries data synchronising and address information and the codes for one display row of 40 characters. This comprises 360 bits and may be considered as 45 eight-bit bytes.

The first two bytes of every data row are a clock run-in sequence of alternating bits, beginning 101010 . . . ., to indicate the presence of a data line and to establish the timing of the data within the decoder. A data timing reference point is defined as the penultimate 1 of the run-in sequence.

The third byte of every data row comprises an even parity framing code 11100100. This is used within the decoder to enable byte synchronisation.

Bytes four and five of every data row contain Hamming coded magazine and row address information. Four bits of each byte carry data with the other four being used for protection; the values of these bits being dependent on the message bits. A single bit error can be corrected and bytes with double errors can be identified within the receiver. Three message bits from the fourth byte define a magazine number in the range 1 to 8. The fourth message bit from this byte and all four message bits from the following byte define a row address. The remaining forty bytes are character bytes containing character generation information.

A teletext decoder must be able to recognise teletext data rows as being valid data and must reject erroneous data. The decoder must not reject large numbers of acceptable data rows, which leads to a long acquisition time for a complete page, nor should it accept false data unduly, which would lead to corrupted pages being displayed.

Existing teletext decoders accept data as teletext on the following basis:

1. All eight bits of the Framing Code must be correct.
2. The Framing Code must be acquired within a timing window (both line and frame timing).
3. The magazine and row address bytes must be either correct or correctable by the Hamming process.

It has teen found that using such a basis it is still possible to incorrectly identify non-teletext data as teletext data. An important source of such non-teletext data has been found to be the Insertion Test Signals (ITS) which are inserted on lines 19 and 20 of the television signal field blanking interval, which lines fall within lines 6 to 22 which are normally considered to be usable as teletext data lines. When these Insertion Test Signals are processed, a data pattern very similar to the Framing Code can be obtained, especially in the case of noisy reception, which results in erroneous data being incorrectly detected as being teletext data.

It is an object of the present invention to provide a teletext decoder having an improved arrangement for detecting valid teletext data.

According to one aspect of the present invention, there is provided a teletext decoder for use in a receiver which is suitable for receiving teletext transmissions, said teletext decoder comprising means for receiving data pulses corresponding to a framing code and Hamming protected magazine and row (or packet) address data included in said transmissions, and validation means operable on said framing code and said Hamming protected magazine and row address data for affording an output indicative of the receipt of valid teletext data, characterised in that said validation means comprises an error checking arrangement for monitoring the errors that may exist in each of the framing code, the magazine data and the row address data and for affording an output indicative of valid teletext data being received if the combined total of errors does not exceed two and where, in the case of two errors, one is in the framing code whilst the other is in the Hamming protected data.

Such a teletext decoder has the advantage that valid rows of teletext data need not be rejected as hitherto if a single error is present in the framing code.

In a preferred teletext decoder, the error checking arrangement affords an output if said combined total of errors does not exceed one.

In the preferred teletext decoder, an output indicative of valid teletext data being received is afforded if a single error exists in the framing code, or in the Hamming protected magazine data or in the Hamming protected row address data and it has been found that a teletext decoder in accordance with the present invention reduces the probability of valid teletext data being rejected and increases the probability of non-teletext data being rejected and not accepted as valid teletext data.

In carrying out the invention according to the preferred first aspect thereof, the validation means may comprise a shift register arrangement to which said data pulses are applied, the shift register arrangement affording outputs corresponding to said framing code and said Hamming protected magazine and row address data, error checking means operable on each of the outputs of said shift register arrangement for affording outputs indicative of the number of errors that exist in said framing code and said Hamming protected magazine and row address data, and means operable on the output of said error checking means for affording an output when the combined total of errors does not exceed one.

A teletext decoder according to said first aspect may be used in a television receiver which is suitable for receiving teletext transmission of a type in which coded data pulses representing alpha-numeric text for display or other teletext information are transmitted in television lines where no picture signals representing normal television picture are present.

According to a second aspect of the present invention there is provided a teletext receiver characterised by a teletext decoder in accordance with said first aspect of the present invention.

According to a third aspect of the present invention there is provided a method of processing a received teletext transmission, comprising the steps of receiving data pulses corresponding to a framing code and Hamming protected magazine and row (or packet) address data included in said transmissions, and carrying out a validation check on said framing code and said Hamming protected magazine and row address data for determining the receipt of valid teletext data, characterised in that said validation check includes the step of monitoring the errors that may exist in each of the framing code, the magazine data and the row address data and the step of affording an output indicative of valid teletext data being received if the combined total of errors does not exceed two and where, in the case of two errors, one is in the framing code whilst the other is in the Hamming protected data.

A preferred method for carrying out said third aspect will be characterised by the step of affording said output if said combined total of errors does not exceed one.

Figure 2:
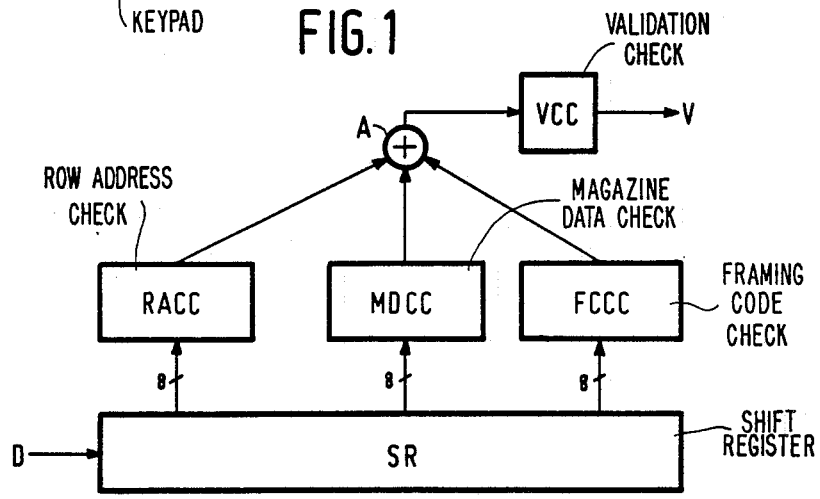

An exemplary embodiment of the invention will now be described reference being made to the accompanying drawings, in which:

FIG. 1 is a block diagram of a teletext television receiver including a teletext decoder in accordance with the present invention; and FIG. 2 is a block diagram showing part of the data acquisition circuit of FIG. 1 in greater detail.

Referring to the drawings, the teletext television receiver shown in FIG. 1 comprises video and data processing circuits for receiving and displaying both normal picture information and teletext information. The front end FE of the receiver comprises the usual amplifying, tuning and i.f. detector circuits, and is connected to receive an incoming television video signal VS. For normal picture display by the television receiver, the demodulated video signal VS' is applied to a colour decoder which produces the R, G and B component signals for the picture display. Time base circuits for a display tube DT receive and usual line and field synchronising pulses from a sync. separator circuit which extracts these synchronising pulses from the video signal VS'. The element CD represents the colour decoder and these other circuit elements which are provided for conventional picture display.

The demodulated video signal VS' is also applied to a teletext decoder section of the teletext television receiver which deals with the receipt and display of the alpha-numeric text and other teletext information that is received in digitally coded form. This section comprises a video processor circuit VP which performs inter alia data slicing for retrieving teletext data pulses D from the video signal VS'. The video processor VP also produces input data clock pulses C from the data pulses D. The data pulses D are fed together with the clock pulses C to a data acquisition circuit DAC which is operable to feed selected groups D/G of the teletext data pulses to a memory MEM as address and display information. The memory MEM has a capacity for storing at least one page of information, comprising a plurality of data rows. The page and row format laid down in the aforementioned "Broadcast Teletext Specification" is assumed.

A logic processor PRO is operable in accordance with select signals S applied to it from a remote control arrangement RC to control which groups of teletext data pulses D/G are acquired by the data acquisition circuit DAC. The arrangement RC has a receiver part RR and a remote transmitter part comprising a transmitter TX and a keypad KP. The processor PRO is further operable to read out from the memory MEM display information for the selected page, for application to a character generator CG which is responsive to this display information to provide R, G, B component signals for the display. A timing circuit TC provides timing signals on connections t1 to t3 for the circuit elements DAC, MEM and CG. These circuit elements and the timing circuit TC are accessed by the processor PRO via an interface circuit INT. The operation of the timing circuit is synchronised with the received video signal VS by a composite pulse signal VCS which contains the line (LS) and field (FS) synchronising pulses which are separated from the demodulated video signal VS' in the video processor VP.

In the teletext television receiver shown in FIG. 1, only single line connections have been shown for the interconnections between the various circuit elements for the sake of simplicity. However, it will be apparent to a person skilled in the art that in practice most of these interconnections would be multi-line. For instance, whereas the teletext data pulses D retrieved from the video signal VS' would be applied serially to the data acquisition circuit DAC over a single connection, serial-to-parallel conversion would take place within this circuit DAC, so that the groups D/G of teletext data pulse would be applied to the memory MEM in parallel over a multi-line connection. Also, the connection between the processor PRO and the interface circuit INT would be a multi-line bus, for instance, a so-called I²C bus. The processor PRO can be a commercially available microcomputer; e.g. from the MAB 8400 Series (Philips). The circuit elements DAC, CG, TC and INT can be the integrated circuit ECCT type SAA 5243 (Philips). The circuit element VP can be the integrated circuit VIP2 type SAA 5231 (Philips). Although a composite television receiver for receiving both normal picture information and teletext information is exemplified in FIG. 1, it will be appreciated that the teletext decoder section for data acquisition together with the front end FE may be provided as a separate teletext decoder which is adapted to feed either a CRT display monitor or a conventional television receiver.

As has already been explained, the video processor circuit VP effects the retrieval of the teletext data pulses D from the video signal VS'. In doing so, a validation check needs to be carried out to ensure that the data pulses D are, in fact, valid teletext data pulses. If they are not, they need to be rejected by the data acquisition circuit DAC.

In FIG. 2 of the drawings, there is shown a validation circuit which forms part of the data acquisition circuit DAC of FIG. 1 for ensuring that the data pulses D are valid teletext data pulses. The arrangement of FIG. 2 comprises a 24 bit shift register SR to which the data pulses D are serially applied. The 24 parallel outputs from the shift register SR are arranged in groups of 8 which are respectively applied to a Framing Code check circuit FCCC, a magazine data (8/4 Hamming code) check circuit MDCC, and a row address (8/4 Hamming code) check circuit RACC. The check circuits FCCC, MDCC and RACC each carry out an error check on the respective outputs from the shift register SR and each afford an output indicative of the number of errors detected to an adder A. The output of the adder A is applied to a validation check circuit VCC which affords an output V when the combined total of errors as determined by the adder A does not exceed one i.e. is equal to or less that one. An output V is indicative that the data pulses D applied to the shift register SR contain valid teletext synchronising and address data. Therefore the teletext decoder can reasonably assume that the following 40 bytes containing character generation information are also valid teletext data and can be processed accordingly.

The validation circuit of FIG. 2 in effect allows a 1 bit in error in 24 bits of Framing Code and Hamming protected data and has advantages over existing validation arrangements in that there is a reduced probability of valid teletext data being rejected, and an increased probability of non-teletext data being rejected and not accepted as valid teletext data.

Whilst the above described embodiment is the preferred way of implementing the present invention, it may be possible to modify the arrangement to permit 2 bits of the Framing Code and Hamming protected data to be in error, providing one of the bits in error exists in the Framing Code and the other in the Hamming protected data. A modification of the validation circuit of FIG. 2 to implement this would be apparent to those skilled in the art and would provide a teletext decoder of slightly lower standard than that already described but which nevertheless would be superior, at least in some respects, to existing teletext decoders.

Although in the foregoing description reference has been made to data rows, it should be appreciated that the principles described are applicable to so-called data "packets", which packets may or may not constitute a data display row. Also, in order to simplify the description, no mention has been made of the requirement that the Framing Code has to be acquired within a predetermined timing window. However, it is to be assumed that the teletext decoder will comprise means for doing this, such means being already known and used in existing teletext decoders.

From reading the present disclosure, other modifications will be apparent to persons skilled in the art. Such modifications may involve other features which are already known per se and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation or modification thereof which would be apparent to persons skilled in the art, whether or not it relates to the same invention as presently claimed in any claim and whether or not it mitigates any or all of the same technical problems as does the present invention. The applicants hereby reserve the right to formulate new claims to such features and/or combinations of such features during the prosecution of the present application or of any further application derived therefrom.

What is claimed is:

1. A teletext decoder for use in a receiver which is suitable for receiving teletext transmissions, said teletext decoder comprising means for receiving data pulses corresponding to a framing code and Hamming protected magazine and row (or packet) address data included in said transmissions, and validation means operable on said framing code and said Hamming protected magazine and row address data for affording an output indicative of the receipt of valid teletext data, characterised in that said validation means comprises an error checking arrangement for monitoring the errors that may exist in each of the framing code, the magazine data and the row address data and for affording an output indicative of valid teletext data being received if the combined total of errors does not exceed two and where, in the case of two errors, one is in the framing code whilst the other is in the Hamming protected data.

2. A teletext decoder as claimed in claim 1, characterised in that the error checking arrangement affords an output if said combined total of errors does not exceed one.

3. A teletext decoder as claimed in claim 2, characterised in that the validation means comprises a shift register arrangement to which said data pulses are applied, the shift register means affording outputs corresponding to said framing code and said Hamming protected magazine and row address data, error checking means operable on each of the outputs of said shift register arrangement for affording outputs indicative of the number of errors that exist in said framing code and said Hamming protected magazine and row address data, and means operable on the output of said error checking means for affording an output when the combined total of errors does not exceed one.

4. A teletext decoder as claimed in any preceding claim, for use in a television receiver which is suitable for receiving teletext transmissions of a type in which coded data pulses representing alpha-numeric text for display or other teletext information are transmitted in television lines where no picture signals representing normal television picture are present.

5. A teletext receiver characterised by a teletext decoder as claimed in claim 1, 2 or 3.

6. A method of processing a received teletext transmission, comprising the steps of receiving data pulses corresponding to a framing code and Hamming protected magazine and row (or packet) address data included in said transmissions, and carrying out a validation check on said framing code and said Hamming protected magazine and row address data for determining the receipt of valid teletext data, characterised in that said validation check includes the step of monitoring the errors that may exist in each of the framing code, the magazine data and the row address data and the step of affording an output indicative of valid teletext data being received if the combined total of errors does not exceed two and where, in the case of two errors, one is in the framing code whilst the other is in the Hamming protected data.

7. A method as claimed in claim 6, characterised by the step of affording said output if said combined total of errors does not exceed one.

8. A teletext receiver characterised by a teletext decoder as claimed in claim 4.

9. Apparatus for validating teletext data, which data includes a framing code, a Hamming protected magazine data, and Hamming protected row address data, the apparatus comprising
   (a) first means for checking for errors in the framing code;
   (b) second means for checking for errors in the magazine data;
   (c) third means for checking for errors in the row address data; and
   (d) means for providing a validation signal when
      (i) none of the first, second, and third means for checking indicates more than one bit in error; and
      (ii) the first, second, and third means for checking indicate no more than one error in the Hamming protected data and no more than one framing code error.

10. The apparatus of claim 9 wherein the providing means provides said validation signal when no more than one of the first, second, and third means for checking indicates an error.

* * * * *